US008636458B2

(12) United States Patent
Auer-Jongepier et al.

(10) Patent No.: US 8,636,458 B2
(45) Date of Patent: Jan. 28, 2014

(54) INTEGRATED POST-EXPOSURE BAKE TRACK

(75) Inventors: Suzan L. Auer-Jongepier, Valkenswaard (NL); Johannes Onvlee, s-Hertogenbosch (NL); Petrus R. Bartray, Ysselsteyn (NL); Bernardus A. J. Luttikhuis, Nuenen (NL); Reinder T. Plug, Eindhoven (NL); Hubert M. Segers, s-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 745 days.

(21) Appl. No.: 11/810,709

(22) Filed: Jun. 6, 2007

(65) Prior Publication Data

US 2008/0304940 A1 Dec. 11, 2008

(51) Int. Cl.
*H01L 21/677* (2006.01)

(52) U.S. Cl.
USPC .......................................... 414/217; 414/287

(58) Field of Classification Search
USPC ................................. 414/217, 287
See application file for complete search history.

(56) References Cited

U.S. PATENT DOCUMENTS

| 4,775,281 | A | * | 10/1988 | Prentakis | 414/416.03 |
|---|---|---|---|---|---|
| 5,788,868 | A | | 8/1998 | Itaba et al. | |
| 6,022,672 | A | | 2/2000 | Ikeda | |
| 6,632,281 | B2 | | 10/2003 | Kitano et al. | |
| 6,698,944 | B2 | | 3/2004 | Fujita | |
| 7,145,643 | B2 | | 12/2006 | Auer-Jongepier et al. | |
| 7,255,747 | B2 | | 8/2007 | Ishikawa et al. | |
| 7,262,829 | B2 | | 8/2007 | Hayashida et al. | |
| 7,364,376 | B2 | | 4/2008 | Sugimoto et al. | |
| 7,379,785 | B2 | | 5/2008 | Higashi et al. | |
| 7,474,377 | B2 | | 1/2009 | Matsuoka et al. | |
| 7,563,323 | B2 | | 7/2009 | Hashinoki et al. | |
| 7,780,438 | B2 | | 8/2010 | Hayashi et al. | |
| 2005/0287821 | A1 | | 12/2005 | Higashi et al. | |
| 2006/0120716 | A1 | | 6/2006 | Hamada | |

(Continued)

FOREIGN PATENT DOCUMENTS

| CN | 1330292 A | 1/2002 |
|---|---|---|
| JP | 03-154324 A | 7/1991 |

(Continued)

OTHER PUBLICATIONS

Translation of Notification of Reasons for Refusal mailed Jan. 27, 2010 for Korean Patent Application No. 10-2008-0053369, 4 pgs.

(Continued)

*Primary Examiner* — Saul Rodriguez
*Assistant Examiner* — Willie Berry, Jr.
(74) *Attorney, Agent, or Firm* — Sterne, Kessler, Goldstein & Fox P.L.L.C.

(57) ABSTRACT

Systems and methods for processing wafers, a combined post expose bake and chill unit, and an interface are disclosed. An exemplary system includes a lithography tool, local track, transfer device, transfer device handler, interface unit, and controller to schedule processing. An exemplary combined post expose bake and chill unit includes an enclosure having an opening in its side, and a bake unit and a chill unit in the enclosure. An exemplary interface includes a plurality of enclosures arranged around robot(s) that transfer wafers among the enclosures, one of the plurality of enclosures being an integrated bake and chill unit.

21 Claims, 7 Drawing Sheets

(56) References Cited

U.S. PATENT DOCUMENTS

| | | |
|---|---|---|
| 2006/0130750 A1 | 6/2006 | Ishikawa et al. |
| 2006/0130751 A1 | 6/2006 | Volfovski et al. |
| 2007/0058147 A1 | 3/2007 | Hamada |
| 2007/0077171 A1 | 4/2007 | Hamada |
| 2007/0117400 A1 | 5/2007 | Matsuoka et al. |
| 2007/0144439 A1* | 6/2007 | Englhardt et al. ............ 118/719 |

FOREIGN PATENT DOCUMENTS

| | | |
|---|---|---|
| JP | 04-239720 A | 8/1992 |
| JP | 07-142356 A | 6/1995 |
| JP | 09-074126 A | 3/1997 |
| JP | 10-284413 A | 10/1998 |
| JP | 11-154637 A | 6/1999 |
| JP | 2001-308005 A | 11/2001 |
| JP | 2004-193597 A | 7/2004 |
| JP | 2004-253507 A | 9/2004 |
| JP | 2004-342654 A | 12/2004 |
| JP | 2005-057294 A | 3/2005 |
| JP | 2005-101058 A | 4/2005 |
| JP | 2005-175310 A | 6/2005 |
| JP | 2006-222398 A | 8/2006 |
| JP | 2006-287178 A | 10/2006 |
| JP | 2007-081117 A | 3/2007 |
| JP | 2007-081121 A | 3/2007 |
| JP | 2007-095893 A | 4/2007 |
| JP | 2008-526030 A | 7/2008 |
| JP | 2008-526032 A | 7/2008 |
| JP | 2008-526033 A | 7/2008 |
| JP | 2008-538654 A | 10/2008 |
| JP | 2008-288498 A | 11/2008 |
| KR | 2006-0098339 A | 9/2006 |
| TW | I323009 B | 4/2010 |

OTHER PUBLICATIONS

English-Language Abstract for JP 03-154324 A, published Jul. 2, 1991; 1 page.

English-Language Abstract for JP 04-239720 A, published Aug. 27, 1992; 1 page.

English-Language Abstract for JP 07-142356 A, published Jun. 2, 1995; 1 page.

English-Language Abstract for JP 09-074126 A, published Mar. 18, 1997; 1 page.

English-Language Abstract for JP 10-284413 A, published Oct. 23, 1998; 1 page.

English-Language Abstract for JP 11-154637 A, published Jun. 8, 1999; 1 page.

English-Language Abstract for JP 2001-308005 A, published Nov. 2, 2001; 1 page.

English-Language Abstract for JP 2004-193597 A, published Jul. 8, 2004; 1 page.

English-Language Abstract for JP 2004-253507 A, published Sep. 9, 2004; 1 page.

English-Language Abstract for JP 2004-342654 A, published Dec. 2, 2004; 1 page.

English-Language Abstract for JP 2005-057294 A, published Mar. 3, 2005; 1 page.

English-Language Abstract for JP 2005-101058 A, published Apr. 14, 2005; 1 page.

English-Language Abstract for JP 2005-175310 A, published Jun. 30, 2005; 1 page.

English-Language Abstract for JP 2006-222398 A, published Aug. 24, 2005; 1 page.

English-Language Abstract for JP 2006-287178 A, published Oct. 19, 2006; 1 page.

English-Language Abstract for JP 2007-081117 A, published Mar. 29, 2007; 1 page.

English-Language Abstract for JP 2007-081121 A, published Mar. 29, 2007; 1 page.

English-Language Abstract for JP 2007-095893 A, published Apr. 12, 2007; 1 page.

English-Language Abstract for JP 2008-288498 A, published Nov. 27, 2008; 1 page.

English Translation of Notice of Reasons for Rejection directed to related Japanese Patent Application No. 2008-148196, mailed on Jan. 21, 2011, from the Japanese Patent Office; 5 pages.

English language translation of the First Office Action directed toward related CN Application No. 201010163953.1, dated Sep. 28, 2011 from the State Intellectual Property Office of People's Republic of China, Beijing, P.R. China; 3 pages.

\* cited by examiner

INTEGRATED POST-EXPOSURE BAKE TRACK

FIELD

The invention generally relates to semiconductor manufacturing processes. More specifically, the invention relates to a photolithographic wafer system.

BACKGROUND

In semiconductor processing, features are fabricated on semiconductor substrates in a cleanroom environment using processing recipes that have many processing steps. A cluster system, which integrates a number of process chambers to perform sequential processing steps without removing substrates from a highly controlled processing environment, is generally used in processing semiconductor substrates.

Many photolithographic cluster systems used in the manufacturing of semiconductor integrated circuits currently incorporate an integrated wafer track and photolithographic system. Various modules within the wafer lithographic cluster perform certain functions including the coating of an underlying semiconductor wafer substrate with photosensitive films referred to as photoresists or resists. In current track systems, the lithography tool is typically directly connected to tracks that take care of both the input processes (e.g., applying the resist) as well as the output processes (e.g., post expose bake/chill and development).

Electronic device manufacturers often spend a large amount of time trying to optimize the process sequence and chamber processing time to achieve the greatest substrate throughput possible given the cluster tool architecture limitations and the chamber processing times. In general, the longest process recipe step generally limits the throughput of the processing sequence.

In addition, certain process steps have stringent time variation requirements. Two such exemplary processing steps include a post exposure bake (PEB) step and a post-PEB chill step. The PEB step is used to heat a substrate immediately after exposure to stimulate diffusion of the photoactive compounds and reduce the effects of standing waves in the photoresist layer. The post-PEB chill step generally cools the substrate after the PEB step to a temperature at or near ambient temperature to assure that the substrate is at a defined temperature, and is typically controlled so that each substrate sees the same time-temperature profile to minimize process variability. The PEB step typically must be linked tightly to the lithography step because variation in the timing between the expose process of the lithography step and the PEB step impacts the Critical Dimension Uniformity (CDU) of the final product.

Similarly, the slowest wafer on either the input or output branch determines the processing time for each lot (i.e., a group of wafers which are to be processed in the same way) in the track. For example, in some cases, if a fast lot is followed by a slow lot, which is followed by a fast lot, each of the lots will run at the speed of the slow lot from the time the slow lot enters the track until the slow lot leaves the track. Similarly, in some other cases, the track schedules around the slowest lot. As a result, the track lets the fast lot run normally, accepting that the slow lot will (partially) empty the track. Thereafter, the track waits to start the fast lot until the slow lot will not stall wafers of the following fast lot. In either situation, the throughput of the entire track-lithography cluster is reduced.

SUMMARY

A wafer processing system is described herein. In one embodiment, the wafer processing system includes a lithography tool; a local track connected with the lithography tool; a transfer device handler to handle the transfer device and transfer wafers from/to the transfer device to/from the lithography tool and/or local track; an interface unit to transfer wafers between the transfer device and the lithography tool and/or local track; and a controller to schedule processing in the lithography tool, local track, interface unit and transfer device handler.

The transfer device handler may handle the transfer devices manually or automatically.

The local track may perform processing steps selected from the group consisting of temperature stabilization, inspection, dry (after expose), post expose bake, chill and combinations thereof. It will be appreciated that the local track may also perform different and/or additional processing steps, including, for example, development steps.

The interface unit may connect the lithography tool with the local track.

The interface unit may connect the transfer device with either or both the lithography tool and the local track.

The transfer device may connect the distant track with either or both the lithography tool and the local track.

The transfer device may be a Front Opening Unified Pod (FOUP), open cassette or Standard Mechanical Interface (SMIF) pod.

A method for processing wafers is also described herein. In one embodiment, the method includes transferring a wafer between a transfer device and a lithography tool; transferring the wafer between the lithography tool and a local track connected to the lithography tool; and transferring the wafer between the local track and the transfer device.

The method may also include one or more selected from the group consisting of stabilizing a temperature of the wafer, drying (after expose) the wafer, post expose baking and chilling in the local track.

The method may also include scheduling the transfer and processing of the wafer.

A combined post expose bake and chill unit is also disclosed herein. In one embodiment, the combined post expose bake and chill unit includes an enclosure having first and second opposing sides having a first length, and third and fourth opposing sides having a second length, the first length being greater than the second length, the enclosure having an opening in the first opposing side to receive a wafer; a bake unit in the enclosure; and a chill unit in the enclosure.

The chill unit may include a gripper.

The bake unit may be isolated within the enclosure.

A robot may also be provided in the enclosure to transfer the wafer within the enclosure.

An interface for a wafer processing system is also described herein. In one embodiment, the interface includes a robot to transport wafers; a plurality of enclosures arranged around the robot, each enclosure having first and second opposing sides having a first length, and third and fourth opposing sides having a second length, the first length being equal or greater than the second length, the enclosure having an opening in the first opposing side to receive a wafer, the opening facing the robot, at least one of the plurality of enclosures being an integrated bake and chill unit.

The interface may include a plurality of robots to transfer wafers, the plurality of enclosures arranged around at least one of the plurality of robots.

At least one of the plurality of enclosures may be a soak unit.

The robot may collect the wafers from a lithographic tool and transfer the wafers to the integrated bake and chill unit.

The robot may transfer the wafers between the lithographic tool, the soak unit and the integrated bake and chill unit.

The interface may also include a plurality of second enclosures arranged around the robot, each second enclosure having first and second opposing sides having a first length, and third and fourth opposing sides having a second length, the first length being greater than the second length, the enclosure having an opening in the third opposing side to receive a wafer, the opening facing the robot.

The interface may include a plurality of robots, wherein the plurality of second enclosures is arranged around at least one of the plurality of robots.

The interface may also include a separate robot to transfer wafers from an external interface connected to the integrated track to the exposure unit.

BRIEF DESCRIPTION OF THE DRAWINGS

The invention is described by way of example with reference to the accompanying drawings, wherein.

DETAILED DESCRIPTION

Systems and methods for processing wafers are disclosed. An exemplary system includes a lithography tool, a local track connected with the lithography tool, a transfer device to transfer wafers from and to the transfer device handler, a transfer device handler to handle the transfer device, an interface unit to transfer wafers between the transfer device and the lithography tool and/or the local track, and a controller to schedule processing in the lithography tool, local track and interface unit. As a result, critical processes can be located closer together and/or the performance of the lithography tool can be independent of the resist and develop process (a distant track associated with the lithography tool).

A combined post expose bake and chill unit is also disclosed. An exemplary combined post expose bake and chill unit includes an enclosure having an opening in a longer side to receive and provide a wafer, and a bake unit and a chill unit in the enclosure.

An interface for a wafer processing system is also disclosed. An exemplary interface includes a plurality of enclosures arranged around one or more robots that transfer wafers among the enclosures, wherein at least one of the plurality of enclosures is an integrated bake and chill unit. As a result, the PEB step can be tightly coupled to the exposure unit to better control timing of the PEB, resulting in better CDU control. The interface also resolves various timing conflicts commonly found at track interfaces. In addition, buffering on the output path can be increased, which relaxes the tight coupling of scheduling of the transfer device from the scheduling of the PEB track. In addition, separate coat and develop scenarios are allowed.

Figure 1:
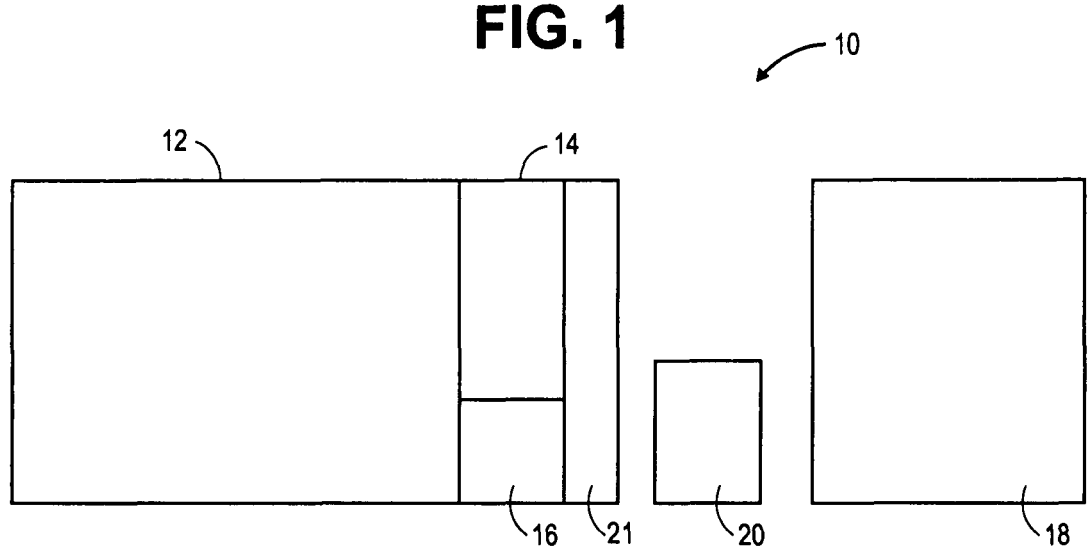
FIG. 1 is a schematic side view illustrating a photolithographic wafer system according to an embodiment of the invention.

FIG. 1 of the accompanying drawings shows a wafer lithography cluster 10. The wafer lithography cluster 10 may incorporate a plurality of processing steps, including, for example, one or more of resist coating, pre- and post-exposure baking, exposure, development, cleaning, chilling, preconditioning, and the like.

The wafer lithography cluster 10 includes a lithography tool 12, a local track section 14, an interface unit 16, and a distant track section 18. In one embodiment, the wafer lithography cluster 10 also includes one or more transfer devices 20. The cluster 10 also includes a transfer device handler 21.

In one embodiment, the local track section 14 is directly connected to the lithography tool 12. That is, a wafer may be directly transferred from the lithography tool 12 to the local track section 14.

In one embodiment, the local track section 14 includes time-critical steps that are linked to the lithography process. Time-critical steps are those processes that have stringent time variation requirements. In one embodiment, time-critical steps are steps that are tightly linked due to the CDU impact on the final product. Exemplary processes included in the local track section 14 include, but are not limited to, for example, inspection, temperature stabilization, dry (after expose), post expose bake, chill, and combinations thereof. In one embodiment, the local track 14 is a post expose bake track. In one embodiment, the local track 14 is a transfer path for wafers from/to the transfer device handler from/to the lithography tool 12.

The distant track section 18 may also be separated from the local track section 14, as illustrated in FIG. 1. The distant track section 18 may be split into multiple units.

In one embodiment, the interface unit 16 is to transfer wafers from the transfer device to the lithography tool 12 and/or the local track section 14, and back. The interface unit 16 may also be used to transfer wafers from and to the transfer device 20. The transfer device 20 may be a pod or cassette in which wafers are placed for transfer.

In one embodiment, the interface unit 16 includes one or more robots (not shown) for transferring the wafers between the lithography tool 12 and the local track section 14. The one or more robots typically each include an actuation mechanism and one or more wafer holders.

In one embodiment, the interface unit 16 includes one or more transfer device handlers. The transfer device handlers may be automatic or manual. The one or more robots may be used to pick wafers from the transfer devices and bring them into the system and bring them back into the transfer devices.

The interface unit 16 may be any indexer as known to those of skill in the art for transferring and processing wafers. The interface unit 16 can be moveable.

The transfer device 20 may be used to transfer wafers between the lithography tool 12 and/or local track section 14 and the distant track section 18. In one embodiment, the transfer device 20 is a Front Opening Unified Pod (FOUP), open cassette or Standard Mechanical Interface (SMIF) pod. The transfer device 20 may be any other transport box as known to those of skill in the art for storing and transferring wafers.

Receiving and sending, and opening and closing, of the transfer device 20 is typically automated. It will be appreciated that the handling of the transfer device 20 may alternatively be manual. The interface unit 16 may include one or more transfer devices. For example, interface unit 16 may include four or five transfer devices. It will be appreciated that fewer than four or greater than five transfer devices may be used.

The wafer lithography cluster 10 also includes a central controller or scheduler (not shown) that schedules the lithography tool 12 and processing in the local track section 14. The central controller may also control the transfer of wafers between the lithography tool 12 and track sections 14 and/or via the interface 16. The central controller may include one or more separate controllers.

In use, a wafer is moved from an input path to the lithography tool 12. In one embodiment, the input path is located in the distant track 18 and the wafer is moved from the distant track 18 to the transfer 20, and from the transfer device 20 to the interface unit 16. From the interface unit 16, the wafer is moved to the lithography tool 12. In one embodiment, a robot in the local track 14 is used to move the wafer. In one embodiment, a robot in the interface unit 16 is used to move the wafer. After the lithography process is completed in the lithography tool 12, the wafer can be transferred from the lithography tool 12 to the local track section 14 or the transfer device 20 for additional processing. After the wafer is processed in the local track section 14, the processing may be completed. Alternatively, the wafer may be transferred from the local track section 14 to the distant track section 18 for additional processing. In one embodiment, the transfer device 20 may be used to transfer the wafer from the local track section 14 to the distant track section 18.

In one embodiment, time critical processes may be located close together to simplify control over critical parameters, which include, for example, wafer temperature and PEB time variations, by including such time critical processes in the local track section 14. The lithography non-critical or less-critical processes may be located in the distant track section 18. Thus, the effect of the time critical processes can be minimized by locating such processes next to one another.

The post-exposure bake performance, which is typically a time critical process, is determined by the number of bake positions and the required bake time. The baking step can be provided in the local track section 14, such that it is essentially integrated with the lithography tool 12. In addition, the local track section 14 can, for example, include all bake units, arranged to provide any number of bake positions needed.

By separating the bake process from other, lesser time critical processes, in the local track section 14, and arranging the bake positions, as needed, the total productivity of the cluster can increase without increasing the floor space.

In one embodiment, the wafer lithography cluster 10 is the same size or smaller than conventional wafer lithography clusters, and parts are independent from each other. As a result, growth paths and upgrade scenarios can be implemented without a large impact on the entire fabrication process.

Figure 2A:
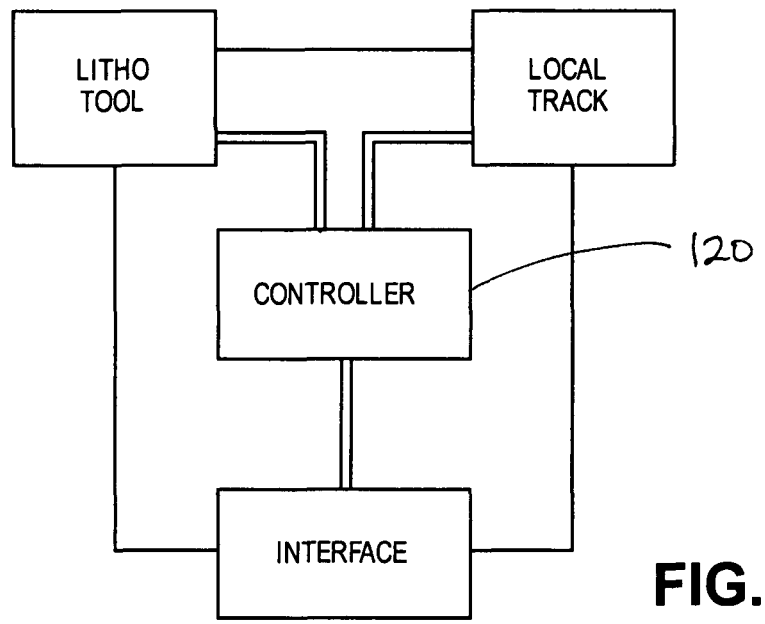
FIGS. 2A, 2B and 2C are block diagrams illustrating photolithographic wafer systems according to an embodiment of the invention.
Figure 2B:
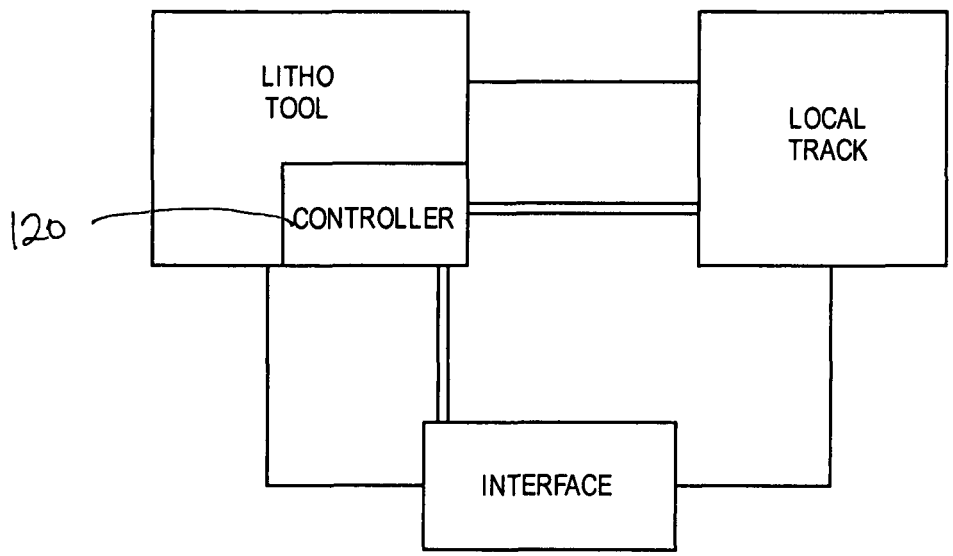
Figure 2C:
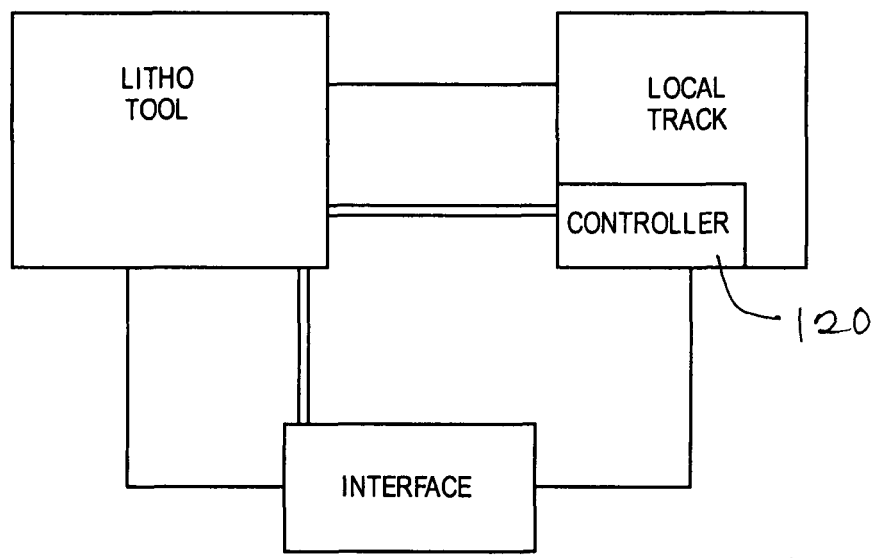

FIGS. 2A, 2B and 2C are block diagrams showing the wafer lithography cluster of FIG. 1 with a controller 120. The controller 120 may be independent of the lithography tool 12, local track section 14 and interface unit 16, as shown in FIG. 2A. Alternatively, as shown in FIG. 2B, the controller 120 may be located in the lithography tool. Alternatively, as shown in FIG. 2C, the controller 120 may be located in the local track.

Figure 3:
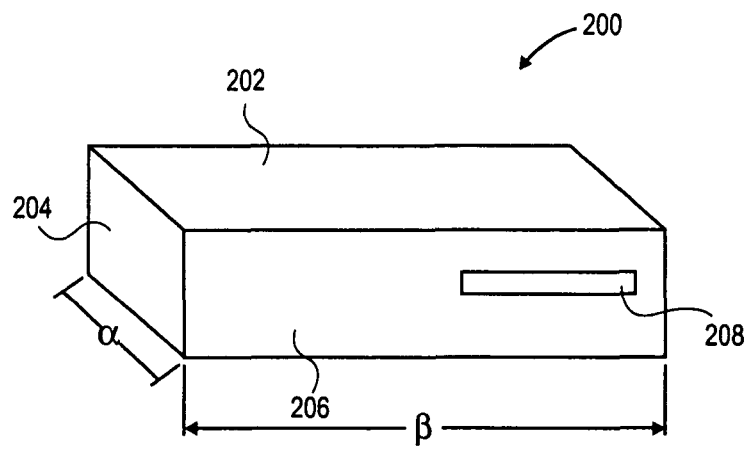
FIG. 3 is a perspective view illustrating a combined bake and chill unit according to an embodiment of the invention.

FIG. 3 is a perspective view of a combined post expose bake and chill unit 200. The unit 200 includes an enclosure 202 having a first side 204 having a first length a and a second side 206 having a second length P. In one embodiment, the second length P is greater than the first length a. The unit also includes an opening 208 in the second side 206.

It will be appreciated that opening 208 may be positioned at nearly any location on the second side 206. Because opening 208 is located in the second side 206, a more densely packed cluster system is possible, as described hereinafter.

Figure 4:
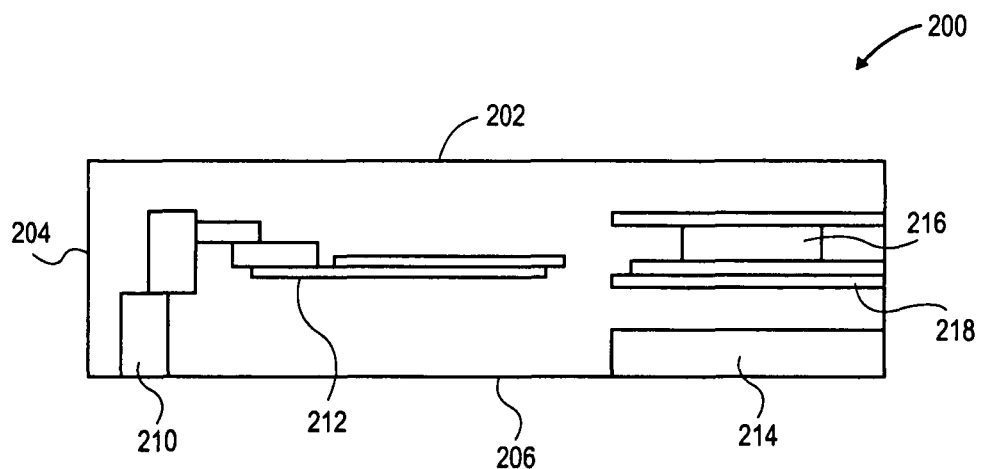
FIG. 4 is a cross-sectional view further illustrating the combined bake and chill unit of FIG. 3 according to an embodiment of the invention.

As shown in FIG. 4, the unit 200 includes a robot 210, a gripper 212 and a bake unit 214. In one embodiment, the unit 200 also includes a buffer position 216. In one embodiment, the unit 200 includes an isolation element 218.

Robot 210 includes an actuation mechanism that allows the wafer to be transferred to various positions within the enclosure 202. It will be appreciated that the unit 200 may include more than one robot and/or grippers.

Gripper 212 may include a holder for supporting the wafer, connected to the robot 210. The gripper 212 may also include chill functionality. For example, the gripper 212 may be water-cooled and controlled.

Bake unit 214 may be any conventional bake unit as known to those of skill in the art. Bake unit 214 should be located at a sufficient distance from a chill position of the gripper 212.

Buffer position 216 is located at or near the opening 208 in second side 206 of the unit. The buffer position 216 may contain chilling.

Isolation element 218 is used to isolate the bake unit 214 from the buffer position 216. In one embodiment, the isolation element isolates the bake unit 214 at all sides of the bake unit 214.

In use, a wafer is placed in opening 208 at the second side 206 of the unit 200. The wafer is located at the buffer position 216. The robot 210 takes the wafer with gripper 212 from the buffer position 216 to the bake unit 214. When the desired bake process is completed at the bake unit 214, the robot 210 moves the wafer away from the bake unit 214 with gripper 212. The chill functionality of the gripper 212 is activated to chill the wafer. When the chill process is completed, the robot 210 returns the wafer to the buffer position 216. When the wafer is returned to the buffer position 216, another robot (not shown) may be used to remove the wafer from the unit 200.

Figure 5:
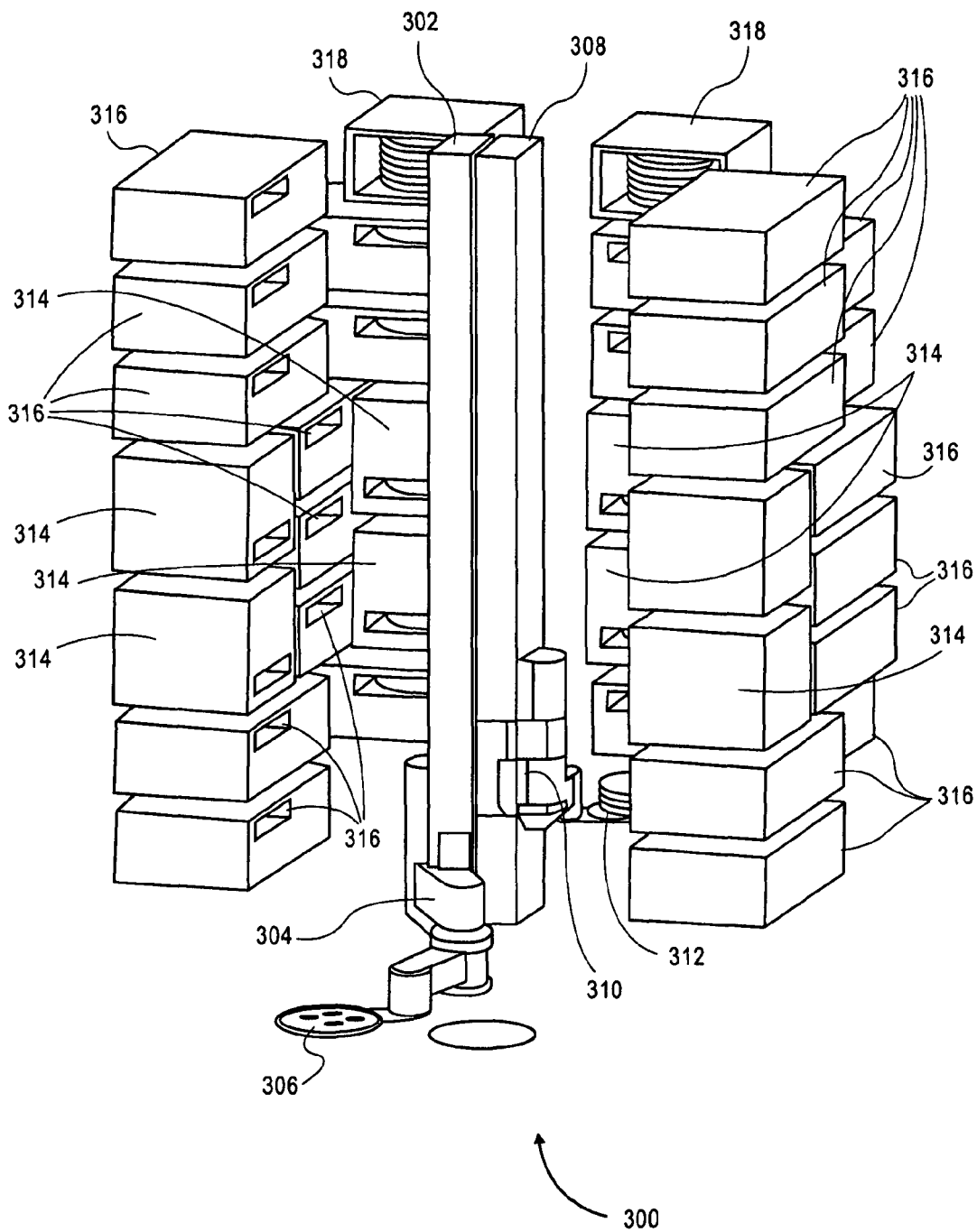
FIG. 5 is a front perspective view illustrating a local track section according to an embodiment of the invention.
Figure 6:
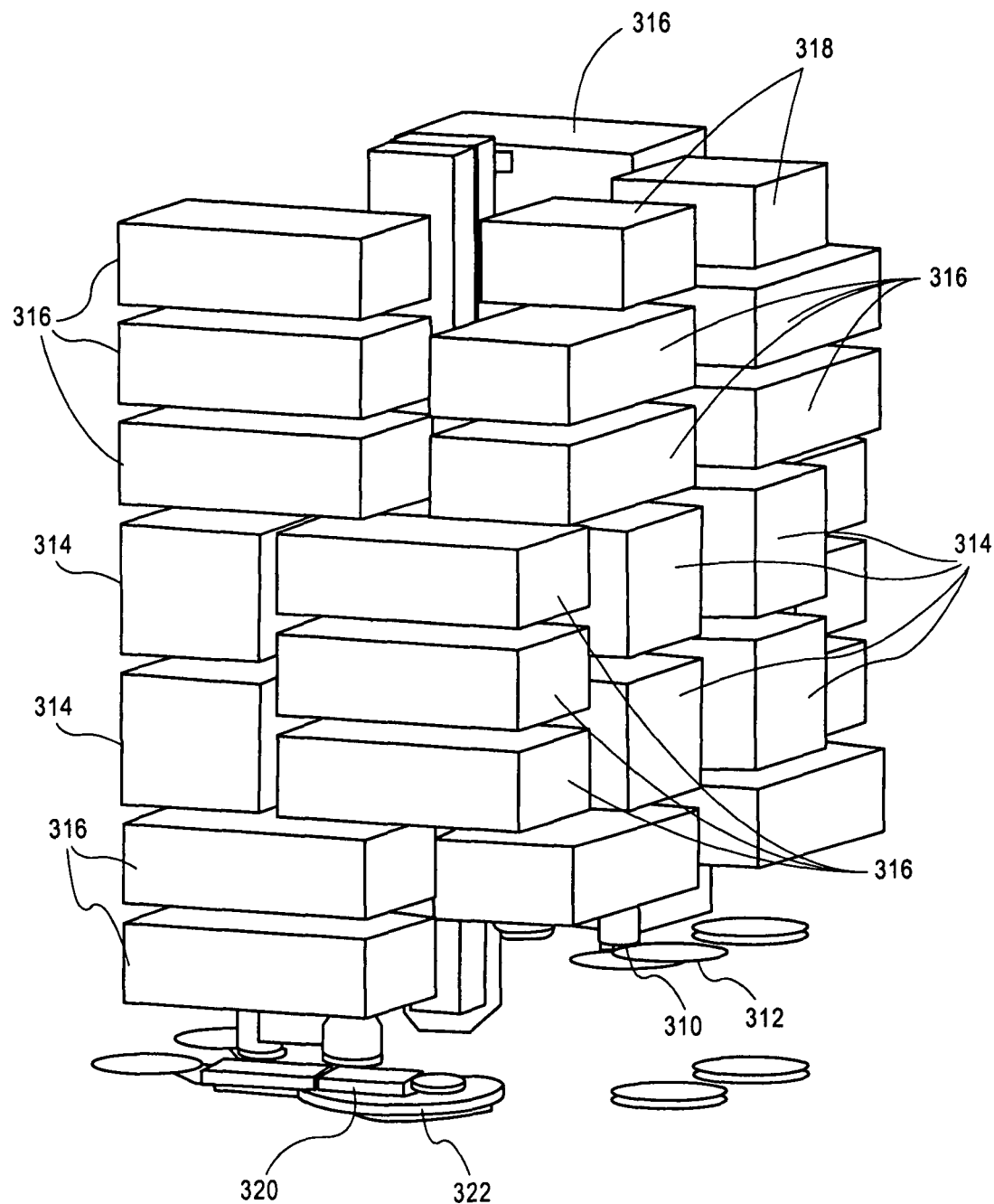
FIG. 6 is a back perspective view illustrating the local track section of FIG. 5.
Figure 7:
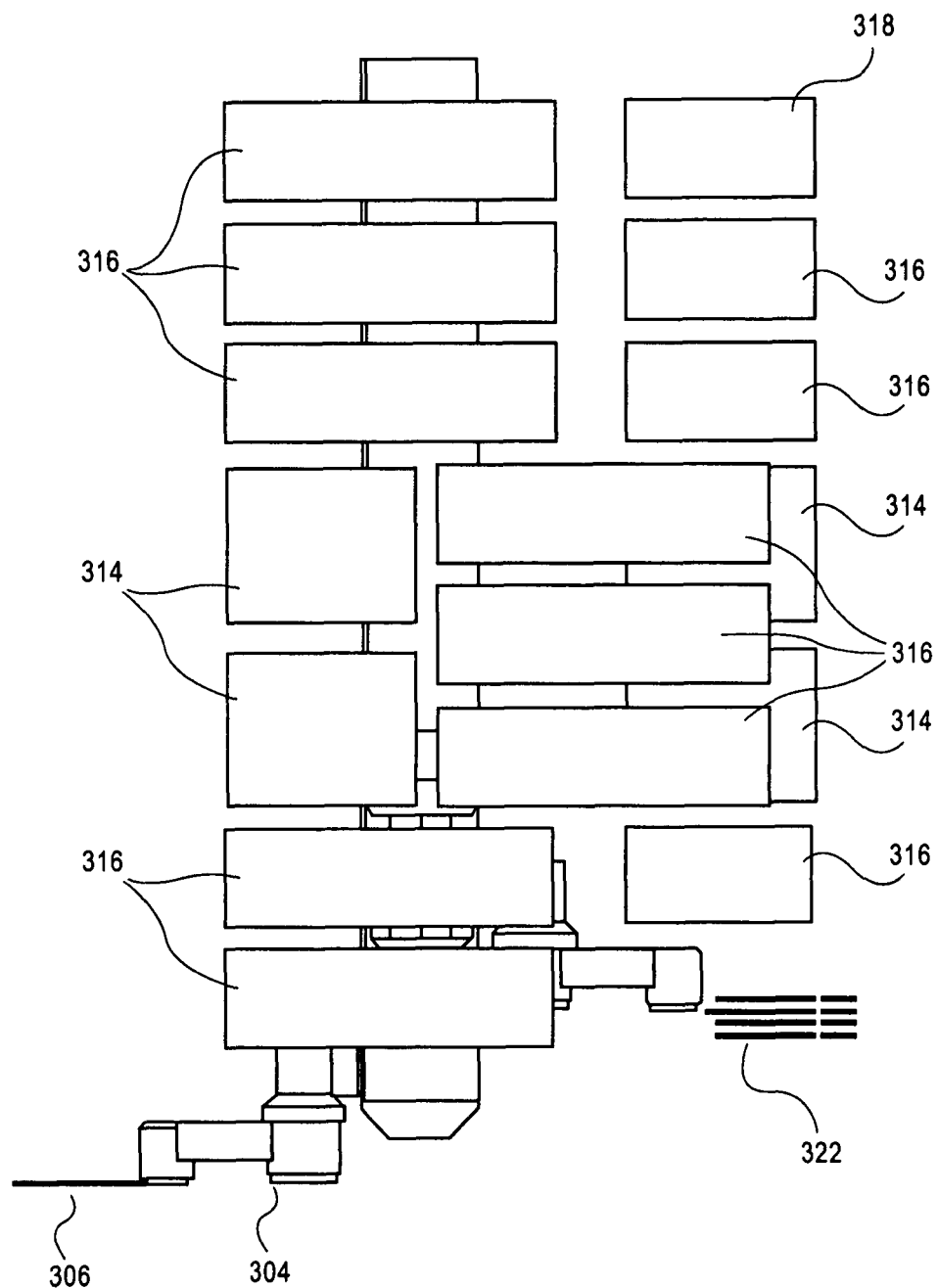
FIG. 7 is a side view illustrating the local track section of FIG. 5.

FIGS. 5-7 illustrate a interface 300 for a wafer lithography cluster.

In one embodiment, the interface 300 is used in the wafer lithography cluster 10, described above with reference to FIG. 1. In one embodiment, the interface 300 is the interface 16, described above with reference to FIGS. 1 and 2, respectively.

As shown in FIG. 5, the interface 300 includes a first guide 302, a first robot 304 and a first gripper 306. The interface 300 may also include a second guide 308, a second robot 310 and a second gripper 312. It will be appreciated that the interface 300 may include more than two robots and more than two grippers. For example, the interface 300 may include three, four or five robots. It will be appreciated that more than five robots may be used. Similarly, the interface 300 may include three, four, five, or even more grippers.

The interface 300 also includes a plurality of units arranged around the robot 310. In the illustrated embodiment, the plurality of units include a plurality of processing units, such as, for example, soak units 314 and post expose bake units 316. Chill plates may also be included in the post exposure bake unit 316. In such an embodiment, the post expose bake unit 316 may be a combined post expose bake and chill unit 200, described above with reference to FIGS. 3 and 4. Chill plates may additionally or alternatively be included in the gripper 306 and/or gripper 312. The interface 300 may optionally include input and/or output buffers 318. It will be appreciated that interface 300 may include any number or type of units, depending on the processing recipe and design constraints.

The plurality of units are arranged around the robots 304 and 310, such that the openings of each of the units can be accessed by the robot 304 and/or robot 310. As described above, the post expose bake unit 316 may be the combined post expose bake and chill unit 200 described above with reference to FIGS. 3 and 4. Because the opening of the illustrated unit 316 is located at its longest side, the plurality of units can be more densely arranged. That is, a larger number of units can be incorporated into the interface 300. As shown in FIGS. 6 and 7, portions of the unit 316 that do not include the opening can be positioned behind other units, such as other post expose bake units 316, soak units 314 or output buffers 318.

The robot 304 and/or robot 310 collect the wafers from the lithographic tool (not shown) or the transfer device (not shown) and transport the wafers within the interface 300. In one embodiment, the one or more robots transport the wafers between the output buffers of the lithographic tool (not shown) and post expose dry units (i.e., soak units) 314. In one embodiment, the one or more robots transfer the wafers between the soak units 314 and the PEB units 316. In one embodiment, the one or more robots transfer the wafers between the PEB units 316 and the output buffer 318 of the interface 300. The one or more robots may include chill plates to cool the wafers after removal from the PEB units 316 and/or the PEB units 316 may be a combined unit having chill plates therein, as described hereinabove. Each robot picks a wafer from the scanner in turn, allowing for multiplexing the time for all internal handling. In one embodiment, robot 306 transfers wafers between the lithographic tool and the soak units 314. In one embodiment, the second robot 310 transfers the wafers between the soak units 314 and the PEB units 316 and, optionally, between the PEB units 316 and the output buffers 318, as discussed above. In one embodiment, the second robot 310 also transfers the wafers to the output interface 322 for transfer to another part of the cluster, such as transfer device 20, and/or interface 16.

As shown in FIG. 6, a dedicated robot 320, which takes care of the input path of all wafers, may also be provided. This reduces the tasks of the robots 304 and 310. In one embodiment, the input path is positioned below the output path.

Each of the robots may be individually controlled and integrated with the lithography tool control to resolve various timing conflicts commonly found with conventional track interfaces.

In use, the gripper 306 picks up wafers via robot 304, and moves the wafers to the post-expose SOAK units 314 or directly to the PEB units 316. After soak, the wafer moves to the PEB units 316 via robot 310 and gripper 312. After the wafer has been chilled, the wafers are moved to an output buffer 318 or to the input/output interface 322.

The foregoing description with attached drawings is only illustrative of possible embodiments of the described method and should only be construed as such. Other persons of ordinary skill in the art will realize that many other specific embodiments are possible that fall within the scope and spirit of the present idea. The scope of the invention is indicated by the following claims rather than by the foregoing description. Any and all modifications which come within the meaning and range of equivalency of the following claims are to be considered within their scope.

The invention claimed is:

1. A wafer processing system comprising:
a lithography tool;
a local track connected with the lithography tool;
a transfer device handler configured and arranged to handle a transfer device and transfer wafers from and to the transfer device;
an interface unit configured and arranged to transfer wafers between one or more of the transfer device and the lithography tool, the lithography tool and the local track, and the local track and transfer device, wherein the interface unit comprises:
a plurality of processing units each having a first side with an access opening, arranged about a common fixed axis such that the first side of each unit faces the axis, wherein each of the processing units comprise one or more of: a soak unit, a post expose bake unit, a post expose bake and chill unit, and an input/output buffer, and wherein the plurality of processing units are densely arranged with portions of some units positioned behind other units while allowing access to all openings; and
two or more robots centrally located with respect to, and external to, the plurality of processing units and configured to move vertically on respective guides co-located along a single, common, axis that is permanently fixed relative to the plurality of processing units;
a distant track separated from the lithography tool and the local track, wherein the transfer device handler is configured to transfer wafers between the distant track and the local track; and
a controller configured and arranged to schedule processing by the lithography tool, local track, distant track, interface unit and transfer device handler, such that the local track is used for time critical processes and the distant track is used for non-critical processes, wherein the length of time that elapses before the wafer begins the non-critical process does not affect the outcome of the non-critical process.

2. The wafer processing system of claim 1, wherein the transfer device handler is configured and arranged to handle the transfer device manually or automatically.

3. The wafer processing system of claim 1, wherein the local track is configured and arranged to perform processing including any of temperature stabilization, inspection, dry (after expose), post expose bake, chill, develop and combinations thereof.

4. The wafer processing system of claim 1, wherein the interface unit connects the lithography tool to the local track.

5. The wafer processing system of claim 1, wherein the interface unit connects the transfer device handler to one or more from either or both of the lithography tool and the local track.

6. The wafer processing system of claim 1, wherein the interface unit is to connect the local track with either or both of the lithography tool and interface.

7. The wafer processing system of claim 1, wherein the transfer device is a Front Opening Unified Pod (FOUP), open cassette or Standard Mechanical Interface (SMIF) pod.

8. A method for processing wars comprising:
providing an interface unit comprising:
a plurality of processing units each having a first side with an access opening, arranged about a common fixed axis such that the first side of each unit faces the axis, wherein each of the processing units comprise one or more of; a soak unit, a post expose bake unit, a post expose bake and chill unit, and an input/output buffer, and wherein the plurality of processing units are densely arranged with portions of some units positioned behind other units while allowing access to all openings; and two or more robots centrally located with respect to, and external to, the plurality of processing units and configured to move vertically on respective guides co-located along a single, common, axis that is permanently fixed relative to the plurality of processing units;

transferring a wafer between a transfer device and a lithography tool;

transferring the wafer between the lithography tool and a local track connected to the lithography tool to perform time critical processes and transferring the wafer between the lithography tool and a distant track separate from the lithography tool to perform non-critical processes, wherein the length of time that elapses before the wafer begins the non-critical process does not affect the outcome of the non-critical process; and transferring, using an interface unit, the wafer between the local track and the transfer device or the distant track.

9. The method of claim 8, further comprising one or more selected from the group consisting of stabilizing a temperature of the wafer, drying (after expose) the wafer, post expose baking, chilling, developing, cleaning and inspection in the local track.

10. The method of claim 8, further comprising scheduling the transfer and processing of the wafer.

11. A processing unit that is part of an interface unit and is a combined post expose bake and chill unit, comprising:
   first and second opposing sides having a first length, and third and fourth opposing sides having a second length, the first length being greater than the second length, and further comprising an opening in the first opposing side to receive a wafer;
   a bake unit internally located within the processing unit;
   a chill unit internally located within the processing unit; and
   a robot internally located within the processing unit and configured to transfer the wafer between the bake unit and the chill unit,
   wherein the processing unit is part of an interface unit comprising:
      a plurality of processing units each having a first side with an access opening, arranged about a common fixed axis such that the first side of each unit faces the axis, wherein each of the processing units comprise one or more of: a soak unit, a post expose bake unit, a post expose bake and chill unit, and an input/output buffer, and wherein the plurality of processing units are densely arranged with portions of some units positioned behind other units while allowing access to all openings; and
      two or more robots centrally located with respect to, and external to, the plurality of processing units and configured to move vertically on respective guides co-located along a single, common, axis that is permanently fixed relative to the plurality of processing units.

12. The processing unit of claim 11, wherein the chill unit comprises at least one gripper.

13. The processing unit of claim 11, wherein the bake unit is isolated within the processing unit.

14. The processing unit of claim 11, further comprising at least one additional robot in the processing unit to transfer the wafer within the enclosure.

15. The processing unit of claim 11, further comprising a transfer device in the processing unit to transfer the wafer within the processing unit.

16. An interface for a wafer processing system comprising:
   a plurality of processing units each having a first side with an access opening, arranged about a common fixed axis such that the first side of each unit faces the axis, wherein each of the processing units comprise one or more of: a soak unit, a post expose bake unit, a post expose bake and chill unit, and an input/output buffer, and wherein the plurality of processing units al e densely arranged with portions of some units positioned behind other units while allowing access to all openings;
   two or more robots centrally located with respect to, and external to, the plurality of processing units and configured to move vertically on respective guides co-located along a single, common, axis that is permanently fixed relative to the plurality of processing units; and
   wherein one of the plurality of processing units comprises:
      an integrated bake unit,
      an integrated chill unit, and
      a, robot internally located within the processing unit and configured to transfer a wafer between the integrated bake unit and the integrated chill unit.

17. The interface of claim 16, wherein at least one of the plurality of processing units is a soak unit.

18. The interface of claim 17, wherein the two or more robots transfer the wafers between the lithographic tool, the soak unit and the one of the plurality of processing units.

19. The interface of claim 16, wherein the two or more robots collect one or more wafers from a lithographic tool and transfers the one or more wafers to the one of the plurality of processing units.

20. The interface of claim 16, further comprising a plurality of second processing units arranged around at least one of the two or more robots, each second processing unit having first and second opposing sides having a first length, and third and fourth opposing sides having a second length, the first length being greater than the second length, each second processing unit having an opening in the third opposing side to receive a wafer, the opening facing the two or more robots.

21. The interface of claim 16, further comprising a separate robot to transfer wafers from an external interface connected to the integrated track to an exposure unit.

* * * * *

UNITED STATES PATENT AND TRADEMARK OFFICE
CERTIFICATE OF CORRECTION

PATENT NO. : 8,636,458 B2  
APPLICATION NO. : 11/810709  
DATED : January 28, 2014  
INVENTOR(S) : Auer-Jongepier et al.

Page 1 of 1

It is certified that error appears in the above-identified patent and that said Letters Patent is hereby corrected as shown below:

In the Claims:
Column 8, line 59, claim 8, delete "wars" and insert --wafers--
Column 8, line 65, claim 8, delete ";" and insert --:--
Column 10, line 22, claim 16, delete "al e" and insert --are--

Signed and Sealed this
Third Day of June, 2014

Michelle K. Lee
*Deputy Director of the United States Patent and Trademark Office*